(12) United States Patent
Ishihara et al.

(10) Patent No.: US 7,291,973 B2
(45) Date of Patent: Nov. 6, 2007

(54) ORGANIC EL DISPLAY HAVING AUXILIARY ELECTRODES FORMED ADJACENT LIGHT EXTRACTION LAYER

(75) Inventors: Shingo Ishihara, Hitachi (JP);
Sukekazu Aratani, Hitachiota (JP);
Masaya Adachi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/082,183

(22) Filed: Feb. 26, 2002

(65) Prior Publication Data

US 2003/0048072 A1     Mar. 13, 2003

(30) Foreign Application Priority Data

Aug. 29, 2001   (JP)   ............................. 2001-259572

(51) Int. Cl.
*H01J 1/62* (2006.01)
*H01J 63/04* (2006.01)
(52) U.S. Cl. .................... 313/505; 313/506; 313/512
(58) Field of Classification Search ........ 313/498–506, 313/512; 257/13, 83, 86
See application file for complete search history.

(56) References Cited

U.S. PATENT DOCUMENTS

| | | | | |
|---|---|---|---|---|
| 4,357,557 A | * | 11/1982 | Inohara et al. ............. 313/509 |
| 4,954,746 A | * | 9/1990 | Taniguchi et al. .......... 313/506 |
| 5,661,500 A | * | 8/1997 | Shinoda et al. .............. 345/60 |
| 5,684,365 A | * | 11/1997 | Tang et al. ............... 315/169.3 |
| 5,739,545 A | | 4/1998 | Guha et al. |
| 5,742,129 A | * | 4/1998 | Nagayama et al. ......... 315/167 |
| 5,804,917 A | * | 9/1998 | Takahashi et al. .......... 313/504 |
| 5,864,206 A | * | 1/1999 | Ishihara et al. ............. 313/506 |
| 5,929,562 A | * | 7/1999 | Pichler ...................... 313/506 |
| 6,049,167 A | * | 4/2000 | Onitsuka et al. ........... 313/512 |

(Continued)

FOREIGN PATENT DOCUMENTS

EP             1076368 A2     2/2001

(Continued)

OTHER PUBLICATIONS

Tsutsui, Tetsuo et al, "Doubling Coupling-Out Efficiency in Organic Light-Emitting Devices Using a Thin Silica Aerogel Layer", pp. 1149-1152, ISSN 0935-9648, vol. 13, No. 15, Aug. 3, w001.

*Primary Examiner*—Joseph Williams
*Assistant Examiner*—Peter Macchiarolo
(74) *Attorney, Agent, or Firm*—Antonelli, Terry, Stout & Kraus, LLP.

(57) ABSTRACT

An organic light-emitting display is provided which includes an organic electroluminescent (EL) substrate, a drive layer formed on the substrate, a first electrode formed on the drive layer; organic layers formed on the first electrode, a second electrode formed on the organic layers, and a plurality of pixels. A counter substrate is formed adjacent the organic EL substrate, and a light extraction layer is formed between the substrate and the counter substrate. Each of the pixels includes sub-pixels and is disposed such that an auxiliary electrode of the second electrode is disposed in a part of one of the sub-pixels. The auxiliary electrode is formed on a same level as the first electrode and is connected to a current supply line within the drive layer via a contact hole formed in an inter-layer insulating layer formed over the drive layer.

13 Claims, 6 Drawing Sheets

U.S. PATENT DOCUMENTS

| | | | |
|---|---|---|---|
| 6,505,901 B1 * | 1/2003 | Fukuda | 313/504 |
| 6,528,824 B2 * | 3/2003 | Yamagata et al. | 257/81 |
| 6,538,374 B2 | 3/2003 | Hosokawa | |
| 6,541,130 B2 * | 4/2003 | Fukuda | 428/690 |
| 6,559,594 B2 | 5/2003 | Fukunaga et al. | |
| 6,621,213 B2 * | 9/2003 | Kawashima | 313/506 |
| 7,084,565 B2 * | 8/2006 | Cho et al. | 313/504 |
| 2001/0004190 A1 * | 6/2001 | Nishi et al. | 313/506 |
| 2001/0024083 A1 * | 9/2001 | Yamazaki et al. | 313/483 |
| 2001/0050532 A1 * | 12/2001 | Eida et al. | 313/504 |

FOREIGN PATENT DOCUMENTS

| | | |
|---|---|---|
| JP | 06-310280 | 11/1994 |
| JP | A-10-223377 | 8/1998 |
| JP | A-2000-178766 | 6/2000 |
| JP | A-2001-230088 | 8/2001 |
| KR | 2001-0078298 | 8/2001 |

* cited by examiner

ORGANIC EL DISPLAY HAVING AUXILIARY ELECTRODES FORMED ADJACENT LIGHT EXTRACTION LAYER

BACKGROUND OF THE INVENTION

The present invention relates to an organic light-emitting element and an organic light-emitting display using the same.

With the advent of a full-fledged multimedia age, growing attention is being focused on a flat-panel display as a man-machine interface.

A liquid crystal display has been used as the flat-panel display. The liquid crystal display, however, has problems such as narrow angles of visibility and low responses.

In recent years, an organic electroluminescent display is being spotlighted as a next-generation flat-panel display. This light-emitting display has excellent characteristics, such as self-luminescence, wide angle of visibility and fast response characteristics.

Conventional organic light-emitting devices have the following structure. On a glass substrate are formed a first transparent electrode such as ITO, a light-emitting layer such as an organic hole transport layer, an organic light-emitting layer and an organic electron transport layer, and a second electrode with a low work function.

A voltage of a few volts is applied between the electrodes to inject holes and electrons into the respective electrodes, which, through the transport layers, combine to produce excitons. When they return to their ground states, the excitons produce light. The emitted light passes through the first transparent electrode and then is extracted from the substrate side.

Refractive indices of the organic layers, the first transparent electrode and the glass substrate are around 1.6, 2.0 and 1.5, respectively. Hence, there are critical angles at boundary surfaces between the first transparent electrode and the glass substrate and between the glass substrate and an air layer into which the outgoing light enters. The critical angle refers to an angle between the incident light and the normal of the substrate at and beyond which the light does not pass the boundary at all and a total reflection occurs. Hence, in the conventional structure, the light extraction efficiency is low and only about 20% of the produced light can be extracted.

There are two types of organic electroluminescent displays, a simple matrix display and an active matrix display.

The simple matrix display has organic layers, such as a hole transport layer, a light-emitting layer and an electron transport layer, formed at intersections between a plurality of anode lines and cathode lines. Each of the pixels lights up for only a selection time in one frame period. The simple matrix displays have an advantage of being simple in construction.

When the number of pixels increases, however, the selection time decreases. This requires increasing a drive voltage to increase the instantaneous brightness, which in turn causes another problem of reducing the longevity of the organic electroluminescent devices. Further, since the organic electroluminescent devices are current-driven, wiring resistances cause voltage drops in a large display-screen, making it difficult to realize uniform qualities among pixels. It follows therefore that there is a limit in the simple matrix displays to the ability to increase the resolution and the size of screen.

In the active matrix displays, each organic electroluminescent device that forms a pixel is connected with a drive cell made up of between two and four thin-film transistor switching devices and thus can light up for a full period of one frame. Thus there is no need to increase the brightness, which in turn extends the lives of the organic electroluminescent devices.

As described earlier, the conventional organic electroluminescent devices extract emitted light from the substrate side and thus the aperture ratio is limited by the drive cells. To solve this problem, it has been attempted to make the upper electrode transparent and extract the emission from the upper electrode side.

U.S. Pat. No. 5,703,436 discloses an organic electroluminescent device in which the upper electrode is of a two-layered structure, with the first layer used as an injection layer of Mg or Ag and the second layer using a transparent electrode of, for example, ITO (Indium Tin Oxide) and with the emitted light extracted from the upper electrode.

JP-A-6-163158 discloses an organic electroluminescent device comprising an electron injection layer made of a transparent alkaline earth metal oxide and a transparent cathode material.

SUMMARY OF THE INVENTION

To prevent total reflection, it is generally necessary to form in the organic electroluminescent element a medium which has a refractive index close to that of a final medium into which the light enters. In that case, the final medium is an air layer and its refractive index is 1. However, when a layer with a refractive index of 1 is formed in the element, the total reflection occurs again at its boundary surface, degrading the light extraction efficiency.

In the organic electroluminescent element which extracts light from the second electrode side, the transparent electrode needs to be formed above the organic layer. The transparent electrode when it is formed causes damages to the organic layer, which is not the case with a metal electrode. Hence, the organic electroluminescent element has a degraded characteristic. It is therefore necessary to study a construction instrumental to enhancing the efficiency.

A first object of the present invention is to provide an organic light-emitting element or organic light-emitting display in which the light produced inside can be projected into the air layer with a refractive index of 1 without degrading the light extraction efficiency due to total reflection.

A second object of the present invention is to provide an organic light-emitting element or organic light-emitting display with a counter substrate, in which the light produced inside can be projected into the air layer with the refractive index of 1 without degrading the light extraction efficiency due to total reflection.

A first aspect of the present invention provides an organic light-emitting element comprising: at least a first electrode, an organic layer, a second electrode and a passivation layer, all formed on a substrate; wherein a distance d from a light-emitting area in the organic layer to an air layer into which produced light enters satisfies an equation:

$$d \leq \lambda/4 \quad (\lambda: \text{center wavelength of emitted light}) \qquad (1)$$

Another aspect of the present invention provides an organic light-emitting element that has a light extraction layer between an organic electroluminescent substrate and a counter substrate.

The light extraction layer is characterized in that it is formed from a material with a refractive index close to 1.

More specifically, the light extraction layer is filled with an inert gas, such as $N_2$, He, Ne and Ar. The possible inert gas is not limited to these.

The counter substrate referred to above is intended to prevent $H_2O$ and $O_2$ in the atmosphere from getting into the second electrode or the organic layer beneath it in the organic electroluminescent substrate. The counter substrate is also intended to extract the light produced in the organic electroluminescent substrate into the air layer with a refractive index of 1. It is therefore desired that the counter substrate be formed of a material with a high visible light transmissivity. More specifically, the material may include, but is not limited to, inorganic materials such as glass and sintered alumina, and a variety of insulating plastics such as polyimide films, polyester films, polyethylene films, polyphenylene sulfide films and polyparaxylene films.

Still another aspect of the present invention provides an organic light-emitting element comprising: an organic electroluminescent substrate having at least a first electrode, an organic layer and a second transparent electrode formed on a substrate; a counter substrate; and a light extraction layer between the organic electroluminescent substrate and the counter substrate; wherein a total thickness d of a layer ranging from a light-emitting area in the organic layer to the second transparent electrode satisfies the equation (1).

Still another aspect of the present invention provides an organic light-emitting element that has a light extraction layer and an auxiliary electrode for the second transparent electrode, both provided between the organic electroluminescent substrate and the counter substrate.

Still another aspect of the present invention provides an organic light-emitting element that has a light extraction layer and an auxiliary electrode for the second transparent electrode, both provided between the organic electroluminescent substrate and the counter substrate, wherein a total thickness d of a layer ranging from a light-emitting area in the organic layer to the second transparent electrode satisfies the equation (1).

It is desired that a rib for controlling the thickness of the light extraction layer be provided between the organic electroluminescent substrate and the counter substrate. It is also desired that the thickness of the light extraction layer is more than 50 μm.

Further, it is desired that the rib be formed on the counter substrate and that it be formed of glass. The rib may be formed of a photo-curing resin.

Further, it is desired that the rib be formed on a sealing portion of the organic electroluminescent substrate and the counter substrate.

Further, it is desired that a color filter layer be formed between the organic electroluminescent substrate and the counter substrate and that it be formed on the counter substrate.

Further, it is desired that a moisture absorbing layer be formed around a portion sealing the organic electroluminescent substrate and the counter substrate.

Further, it is desired that the auxiliary electrode be formed between pixels formed on the counter substrate.

Further, it is desired that a bonding layer be provided to bring the second transparent electrode and the auxiliary electrode into ohmic contact with each other.

Further, it is desired that the auxiliary electrode be formed between pixels and that it be formed on the second transparent electrode.

A further aspect of the present invention provides an organic light-emitting display using the organic light-emitting element.

The organic light-emitting display of this invention should preferably have a construction in which the organic light-emitting elements corresponding to red, green and blue are arranged in each pixel and in which the auxiliary electrode is arranged on a part of the organic light-emitting element with a high efficiency or a long life. It is preferred that the second electrode use an ultra-thin metal film with a high transmissivity.

The organic light-emitting element referred to above has a construction in which a first electrode, a first injection layer, a first transport layer, a light-emitting layer, a second transport layer, a second injection layer, a second transparent electrode, a passivation layer, or a counter substrate is formed over the substrate.

There are largely two constructions of the organic light-emitting element.

The first construction is one in which the first electrode is an anode and the second transparent electrode is a cathode. In this case, the first injection layer and the first transport layer are a hole injection layer and a hole transport layer, respectively. The second transport layer and the second injection layer are an electron transport layer and an electron injection layer, respectively.

The second construction is one in which the first electrode is a cathode and the second transparent electrode is an anode. In this case, the first injection layer and the first transport layer are an electron injection layer and an electron transport layer, respectively. The second transport layer and the second injection layer are a hole transport layer and a hole injection layer, respectively.

The constructions described above may not have the first injection layer or the second injection layer. Further, the first transport layer or the second transport layer may serve as a light-emitting layer.

The anode is preferably a conductive film with a large work function that can enhance the hole injection efficiency. More specifically, the materials of the anode may include, but are not limited to, gold and platinum.

Among other possible materials are an $In_2O_3$—$SnO_2$-based transparent conductive film and an $In_2O_3$—ZnO-based transparent conductive film. Particularly, the $In_2O_3$—$SnO_2$-based transparent conductive film is used for the pixel electrodes in liquid crystal displays. The processing methods for the transparent materials include a sputtering process and an EB deposition method.

The work functions for both the $In_2O_3$—$SnO_2$-based transparent conductive film and the $In_2O_3$-ZnO-based transparent conductive film are 4.6 eV. This can be increased up to 5.2 eV by using UV radiation and oxygen plasma processing.

In the $In_2O_3$—$SnO_2$-based transparent conductive film, sputtering with the substrate temperature elevated to around 200° C. results in a polycrystalline state. In the polycrystalline state, the etch rate within the grains differ from that at the grain boundaries, and thus an amorphous state is desirable.

The provision of the hole injection layer obviates the need to use a material with a large work function for the anode, and an ordinary conductive film may be used. Candidate materials include, for example, metals, such as aluminum, indium, molybdenum and nickel, their alloys, and inorganic materials such as polysilicon, amorphous silicon, tin oxide, indium oxide, indium-tin oxide (ITO).

Organic materials and conductive inks such as polyaniline and polythiophene are desirable which can be applied with a simple application method in the manufacturing process.

Materials are not limited to these. It is also possible to use two or more of these materials in combination.

For the hole injection layer, desirable materials should have an appropriate level of ionization potential to lower the injection barriers of the anode and the hole transport layer. It is also preferred that the selected material be able to smooth out the rough surface of the base layer. More specifically, the possible materials include, but are not limited to, copper phthalocyanine, starburst amine compound, polyaniline, polythiophene, vanadium oxide, molybdenum oxide, ruthenium oxide and aluminum oxide.

The hole injection layer has a role of carrying holes and injecting them into the light-emitting layer. Hence, it preferably has a high hole mobility. It is also desired that the hole injection layer be chemically stable and low in ionization potential. It preferably has a small electron affinity and a high glass transition temperature.

More specifically, the hole injection layer is preferably formed of N,N-bis(3-methylphenyl)-N,N-diphenyl-[1,1-biphenyl]-4,4-diamine (TPD), 4,4-bis[N-(1-naphthyl)-N-phenylamino]biphenyl($\alpha$-NPD), 4,4,4-tri(N-carba zolyl)triphenylamine (TCTA), and 1,3,5-tris[N-(4-diphenylaminophenyl)phenylamino] benzene(p-DPA-TDAB). The material is not limited to these and two or more of them may be used in combination.

The light-emitting layer refers to a layer in which the injected holes and electrons recombine to produce light of a wavelength unique to the material. A host material itself that forms the light-emitting layer may illuminate or a dopant material added in a minute amount to the host may emit light.

Possible host materials include distyrylarylene derivative (DPVBi), silole derivative having a benzene ring as a skeleton (2PSP), oxiodiaxole derivative having triphenylamine structure at ends (EM2), perinone derivative having phenanthrene group, oligothiophene derivative having triphenylamine structure at both ends (BMA-3T), perylene derivative (tBu-PTC), tris (8-quinolinole) aluminum, polyparaphenylene vinylene derivative, polythiophene derivative, polyparaphenylene derivative, polysilane derivative, and polyacetylene derivative.

Preferred dopant materials include quinacridone, coumarin 6, nile red, rubrene, DCM, dicarbazole derivative. The dopants are not limited to these materials and two or more of them may be used in combination.

The electron transport layer mentioned above has a role of carrying electrons and injecting them into the light-emitting layer. It is therefore desirable that it has a high electron mobility. More specifically, the electron transport layer is preferably formed from, but not limited to, tris(8-quinolinole) aluminum, oxodiazole derivative, silole derivative, and zinc benzothiazole complex. Two or more of these materials may be used in combination.

The electron injection layer is designed to improve the efficiency of injecting electrons from the cathode into the electron transport layer. This injection layer is preferably formed from, but not limited to, lithium fluoride, magnesium fluoride, calcium fluoride, strontium fluoride, barium fluoride, magnesium oxide, and aluminum oxide. Two or more of them may be used in combination.

The cathode preferably is a conductive film with a small work function for enhancing the electron injection efficiency. More specifically, the cathode preferably is formed from, but not limited to, magnesium-silver alloy, aluminum-lithium alloy, aluminum-calcium alloy, aluminum-magnesium alloy, and metal calcium.

The provision of the electron transport layer obviates the need for a material with a small work function for the cathode, and an ordinary conductive film may be used. Candidate materials include, for example, metals, such as aluminum, indium, molybdenum and nickel, their alloys, and inorganic materials such as polysilicon and amorphous silicon.

In this invention, when the cathode is used as the second transparent electrode, it is desired that an electron injection layer be provided beneath the cathode. The provision of the electron injection layer allows the use of a transparent conductive film with a low work function. More specifically, possible materials include an $In_2O_3$—$SnO_2$-based transport conductive film and an $In_2O_3$—$ZnO$-based transparent conductive film. Particularly, the $In_2O_3$—$SnO_2$-based transport conductive film is used for pixel electrodes in liquid crystal displays. The manufacturing processes for the transparent electrode include a sputter method and an EB deposition method.

The passivation layer in this invention is formed on the second electrode and intended to prevent $H_2O$ and $O_2$ in the atmosphere from getting into the second electrode or the organic layer beneath it. More specifically, the materials for the passivation layer may include, but are not limited to, inorganic materials such as $SiO_2$, SiNx and $Al_2O_3$, and organic materials such as polychloropyrene, polyethylene terephthalate, polyoxymethylene, polyvinylchloride, polyvinyliden fluoride, cyanoethyl pullulan, polymethyl methacrylate, polysulfone, polycarbonate, and polyimide.

The light-emitting area refers to an area in the light-emitting layer that produced light. The holes and electrons injected into the light-emitting layer recombine to produce excitons which diffuse in the light-emitting layer. The diffusion distance varies depending on the host material of the light-emitting layer and on the presence or absence of a dopant material. Thus, the distance d from the light-emitting area in the organic layer to the layer from which the light is projected out is defined as a distance from the boundary between the first transport layer and the light-emitting layer to the air layer.

When the distance d is equal to or less than ¼ the center wavelength of the produced light, the light is not affected by the classic optics. Hence, there is no loss due to total reflection, improving the light extraction efficiency.

Application of the organic light-emitting display of this invention to the display portion of cellular phones can increase the quantity of light in the display portion to a level not possible with the conventional cell phones. Further, the use of this display reduces resistance and therefore power consumption.

Other objects, features and advantages of the invention will become apparent from the following description of the embodiments of the invention taken in conjunction with the accompanying drawings.

DESCRIPTION OF THE EMBODIMENTS

Embodiment 1

Figure 1A:
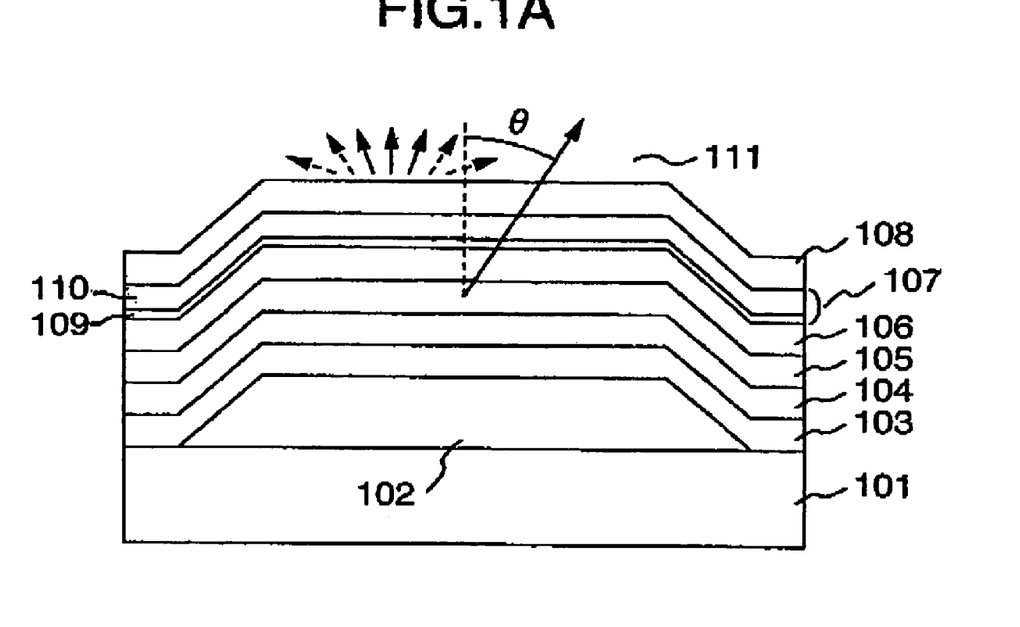
FIG. 1A is a schematic cross-sectional view of an organic light-emitting element according to an embodiment 1 of the present invention.
Figure 1B:
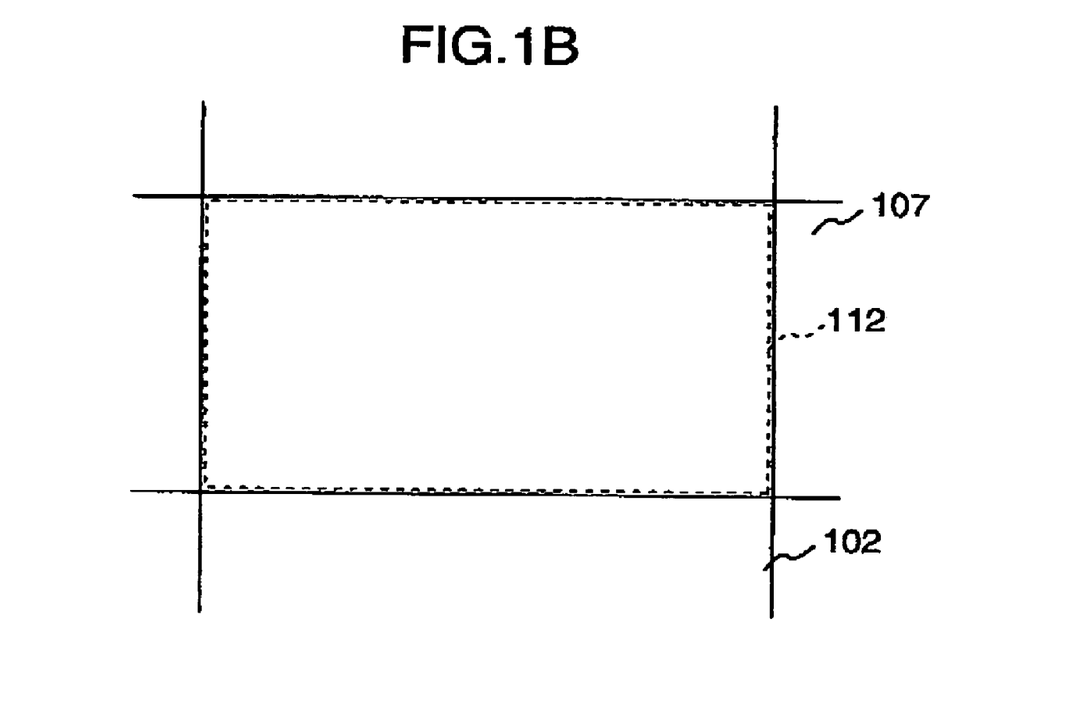
FIG. 1B is a plan view of a pixel area of the organic light-emitting device of FIG. 1A.

Now embodiments of the organic light-emitting element according to the present invention will be described. FIG. 1A is a schematic cross-sectional view of an organic light-emitting element of this invention and FIG. 1B is a plan view showing a pixel area of the element.

On a glass substrate 101 is deposited an ITO film to a thickness of 150 nm by sputtering process. Next, a first transparent electrode 102 with an area of 2×2 mm² is formed by photolithography.

The glass substrate 101 formed with the first transparent electrode 102 was subjected to three minutes of ultrasonic cleaning using acetone and pure water in that order. After cleaning, the substrate was dried by a nitrogen gas and further dried in an oven at 80° C.

Next, the substrate was subjected to an $O_2$ plasma cleaning with the plasma cleaning chamber set at a vacuum level of 3 Pa, an inflow of $O_2$ at 22 ml, an RF (radio frequency) power at 20 W, and a cleaning duration at 3 minutes. After the $O_2$ plasma cleaning, the substrate was placed in a vacuum deposition chamber without being exposed to open air.

Next, a copper phthalocyanine film (hereinafter abbreviated CuPc film) was deposited to a thickness of 20 nm by vacuum deposition. About 20 mg of the material was put in a sublimate boat made of Mo and evaporated at a controlled deposition rate of 0.15±0.05 nm/sec. This CuPc film functions as an organic hole injection layer 103. Over the CuPc film 4,4-bis[N-(1-naphtyl)-N-phenylamino]biphenyl (hereinafter abbreviated α-NPD film) was formed to a thickness of 50 nm by vacuum deposition.

About 60 mg of the material was put in the sublimate boat made of Mo and evaporated at a controlled deposition rate of 0.15±0.05 nm/sec. The α-NPD film works as an organic hole transport layer 104. Over the α-NPD film a co-deposited film of tris (8-quinolinol) aluminum (hereinafter abbreviated Alq) and (quinacridone) (hereinafter abbreviated Qc) was formed to a thickness of 20 nm by a binary simultaneous vacuum deposition.

About 40 mg of Alq and about 10 mg of Qc were put in two sublimate boats made of Mo and were evaporated at controlled deposition rates of 0.40±0.05 nm/sec and 0.01±0.005 nm/sec, respectively. The Alq+Qc co-deposited film functions as an organic light-emitting layer 105. Over this co-deposited film an Alq film was formed to a thickness of 20 nm by vacuum deposition.

About 40 mg of the material was put in a sublimate boat of Mo and evaporated at a controlled deposition rate of 0.15±0.05 nm/sec. The Alq film functions as an organic electron transport layer 106.

Next, a second transparent electrode 107 was formed. First, an alloy film of Mg and Ag was formed as an electron injection layer 109. This alloy film was deposited to a thickness of 10 nm by a binary simultaneous vacuum deposition with their deposition rates set to 0.14±0.05 nm/sec and 0.01±0.005 nm/sec, respectively.

Next, an In—Zn—O film was formed to a thickness of 50 nm by sputtering process. This film is an amorphous oxide film that functions as a transparent electrode 110. A target used was In/(In+Zn)=0.83. The deposition was performed in the presence of a mixture gas of Ar and $O_2$ at a vacuum level of 0.2 Pa and with a sputtering output of 2W/cm². The second transparent electrode 107 made of a Mg:Ag/In—ZnO laminated film functions as a cathode and its transmissivity was 65%.

Next, a SiNx film was formed to a thickness of 35 nm by a thermal CVD method. This film functions as a passivation film 108.

The organic light-emitting element of this embodiment illuminates at a central wavelength of 525 nm. The light emitting area is distributed almost uniformly over the organic light-emitting layer 105. Hence, the total thickness d of a layer ranging from the light-emitting area to the outer surface of the passivation film 108 in contact with an air layer with a refractive index of n=1 is given as follows and satisfies the preceding equation (1).

$$115 \text{ nm } (= 20 + 10 + 50 + 35) \leq d \leq$$
$$135 \text{ nm } (= 20 + 20 + 10 + 50 + 35) < 137.5 \text{ nm } (= \lambda/4)$$

For comparison, an organic light-emitting element with the transparent electrode 110 set to 150 nm in thickness was fabricated. This film thickness is a commonly used thickness for the transparent electrode. Other layers were manufactured under the same conditions as those of this embodiment. The total thickness d of a layer ranging from the light-emitting area to the outer surface of the passivation film in contact with the air layer 111 having a refractive index of n=1 is given as follows and does not meet the equation (1).

$$137.5 \text{ nm } (=\lambda/4) < 215 \text{ nm} \leq d \leq 235 \text{ nm}$$

In the organic light-emitting elements of this embodiment and of the comparison example, when a voltage of 5V was applied between the first transparent electrode 102 and the second transparent electrode 107, the pixel area 112 lighted up in green. With the organic light-emitting element slanted (θ) with respect to the normal direction, measurements were made of the brightness of light emitted from the passivation film 108 by using a brightness photo meter. Both in this embodiment and the comparison example, the brightness was 100 cd/m² for θ=0°.

As the element was slanted, the brightness in the comparison example decreased along a curve of a total diffusion surface whereas the brightness in this embodiment remained almost constant. This is explained as follows. In the element of this embodiment, the total reflection did not occur for the outgoing light with an incident angle greater than the critical angle. Thus, the total amount of light from the organic light-emitting element of this embodiment increased to 1.5 that of the comparison example.

Embodiment 2

Figure 2A:
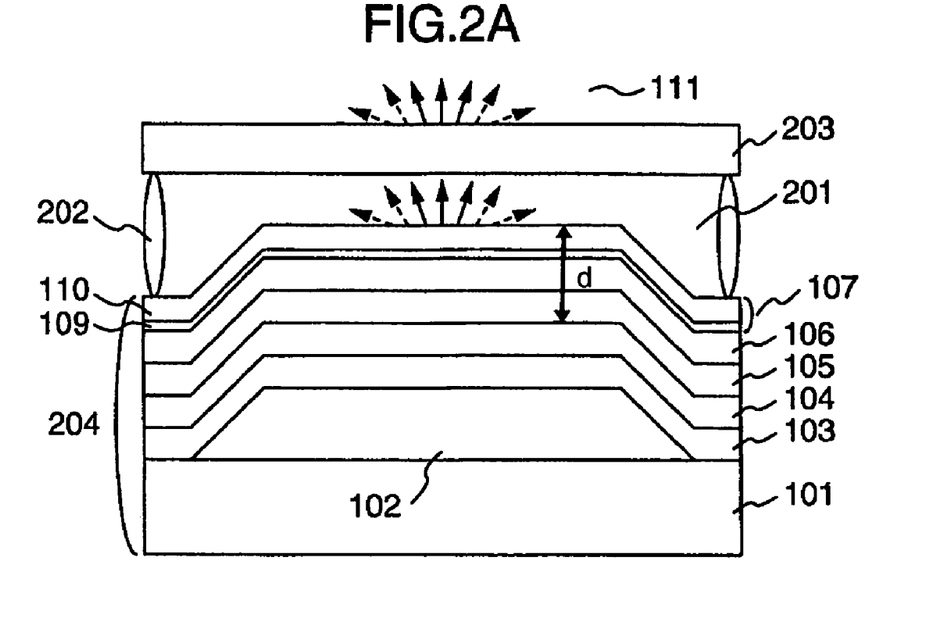
FIG. 2A is a schematic cross-sectional view of an organic light-emitting element according to an embodiment 2 of the present invention.
Figure 2B:
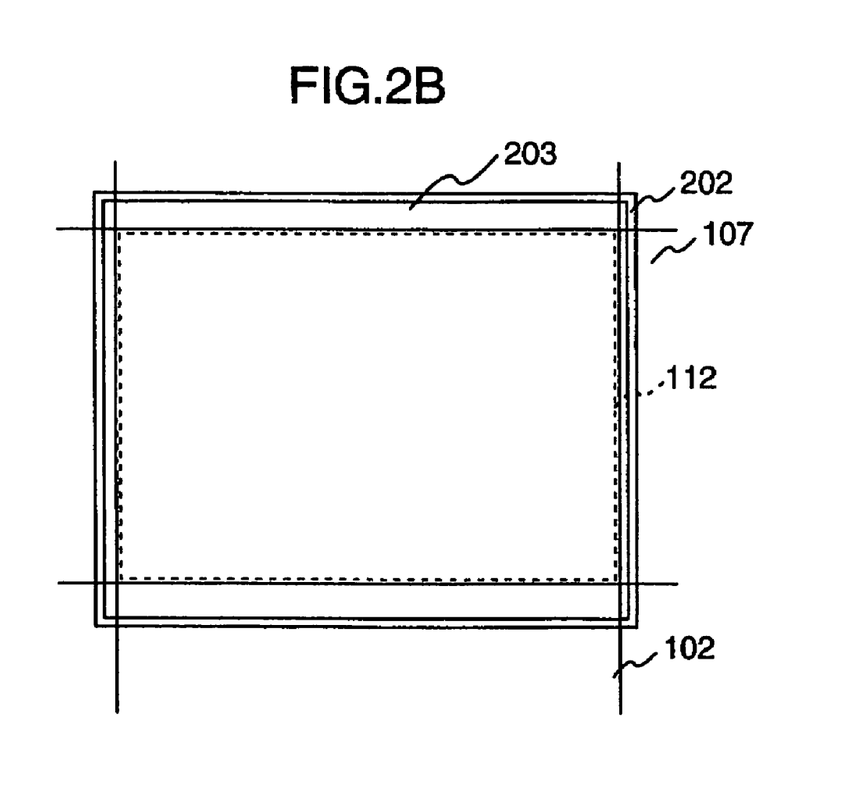
FIG. 2B is a plan view of a pixel area of the organic light-emitting device of FIG. 2A.

Now, an organic light-emitting element of this embodiment having a counter substrate will be explained. FIG. 2A is a schematic cross section showing the organic light-emitting element of this embodiment and FIG. 2B is a plan view of a pixel.

An organic electroluminescent substrate 204 is manufactured as follows. On a glass substrate 101 were formed a first transparent electrode 102, an organic hole injection layer 103, an organic hole transport layer 104, an organic light-emitting layer 105, an organic electron transport layer 106, and a second transparent electrode 107. The fabrication conditions are the same as those of the embodiment 1. The organic light-emitting layer 105, the organic electron transport layer 106 and the second transparent electrode 107 were set in thickness to 20 nm, 20 nm and 60 nm, respectively.

Next, the organic electroluminescent substrate 204 was moved into a sealing chamber whose dew point was kept below −90° C. and dried by circulating a dry nitrogen gas without being exposed to open air.

Then, a glass substrate was introduced into the sealing chamber. This glass substrate serves as the counter substrate 203. A seal dispenser was used to apply an optically cured resin 202 to edge portions of the glass counter substrate 203.

The seal width of the photo-cured resin 202 was set to 200 μm. The photo-cured resin 202 was mixed with 1% by weight of glass beads 10 μm in diameter. The counter substrate 203 and the organic electroluminescent substrate 204 were bonded together under a pressing load of 0.5 kgf/cm$^2$ in the sealing chamber. On the outside of the counter substrate a light shielding plate was arranged to protect the pixel area 112 from ultraviolet light. The ultraviolet light was radiated from the counter substrate side to harden the optically cured resin 202.

An alkali metal halide lamp was used to irradiate ultraviolet light at a radiation intensity of 4000 mJ/cm$^2$ for four minutes.

A gap length between the organic electroluminescent substrate 204 and the counter substrate 203 is 10 μm, which is determined by the diameter of the glass beads included in the optically cured resin 202. This gap is filled with a dry nitrogen gas with a refractive index of n=1. This layer is defined as a light extraction layer 201. The total thickness d of a layer ranging from the light-emitting area of the organic light-emitting layer 105 to the surface of the second transparent electrode 107 in contact with the light extraction layer 201 is given as follows and its relation with the center wavelength of emission meets the equation (1).

$$80 \text{ nm } (= 20 + 60) \leq d \leq 100 \text{ nm } (= 20 + 20 + 60) < 137.5 \text{ nm} (= \lambda/4)$$

Therefore, as in the embodiment 1, the light produced by the light-emitting area is not total-reflected at a boundary surface between the second transparent electrode 107 and the light extraction layer 201 even when its angle of incidence is more than a critical angle, and is transmitted to the light extraction layer 201.

When the light that has propagated into the light extraction layer 201 goes out from the counter substrate 203 into the air layer 111 with a refractive index of 1, there is no total reflection thus reducing the loss due to total reflection. As a result, the total amount of light produced by the organic light-emitting element of this embodiment has increased to 1.5 times that of the element of normal thickness.

Embodiment 3

Figure 3:
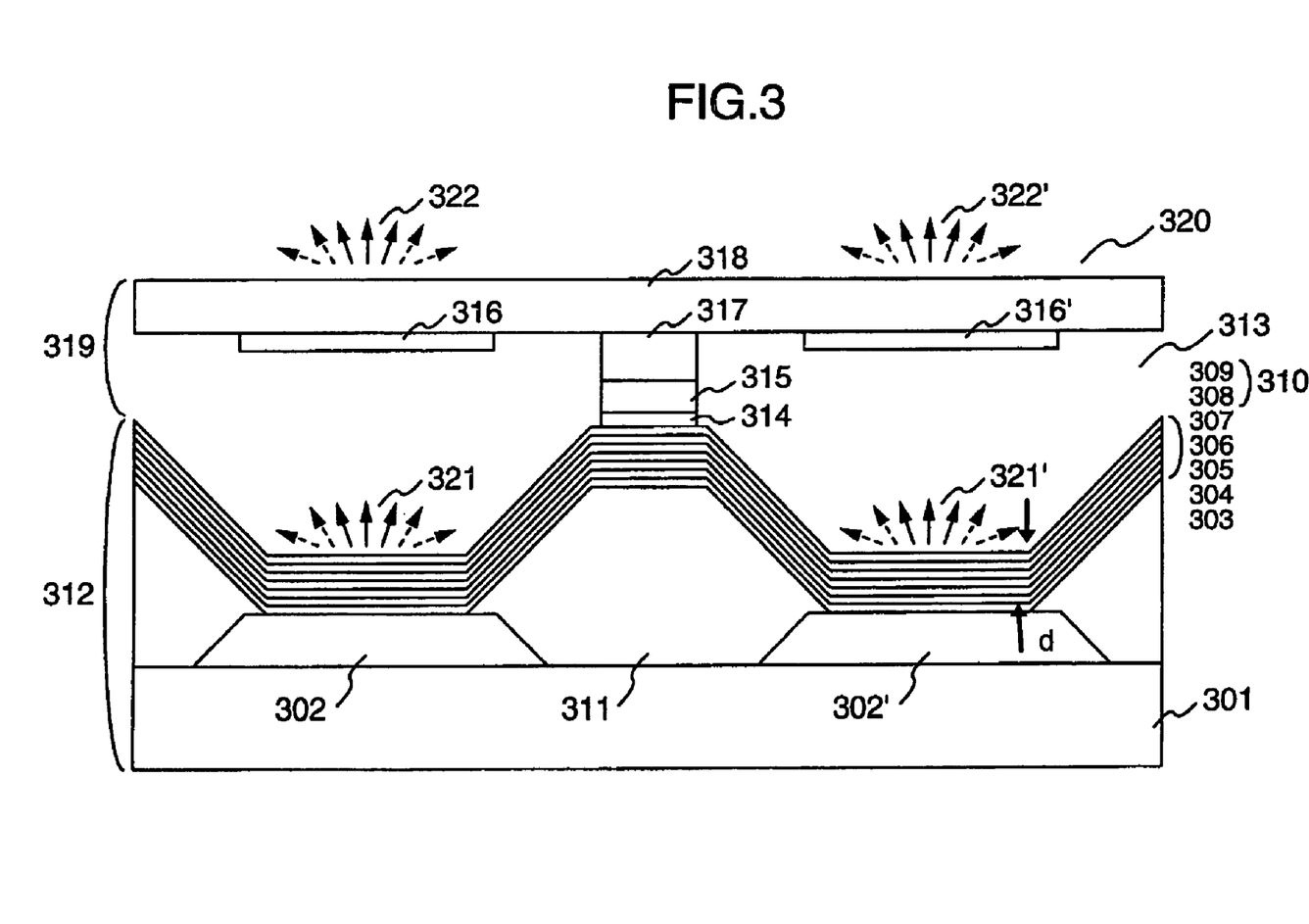
FIG. 3 is a schematic cross-sectional view of an organic light-emitting display according to an embodiment 3 of the present invention.
Figure 4:
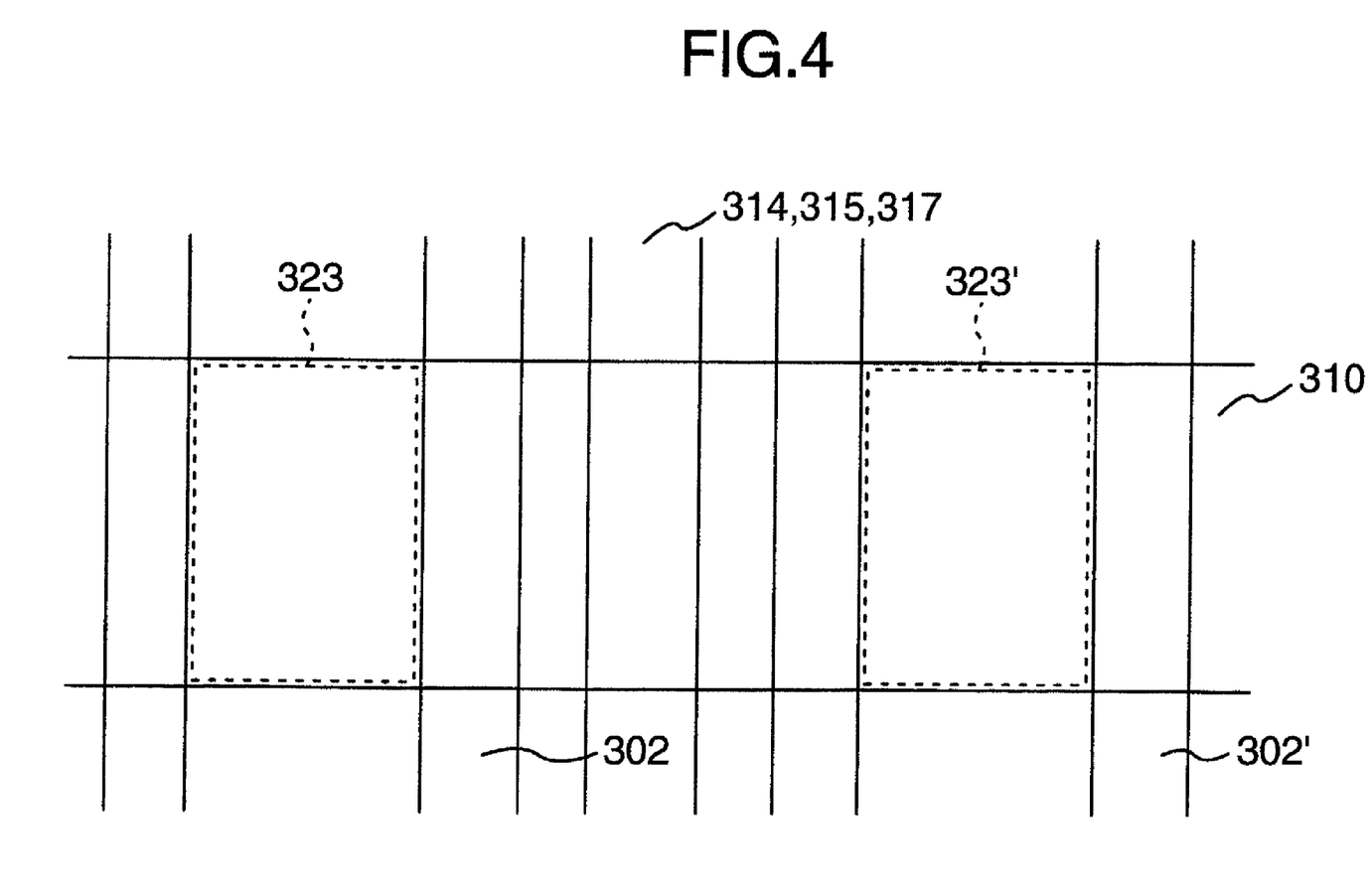
FIG. 4 is a plan view of a pixel area of the organic light-emitting display according to the embodiment 3.

In this embodiment, the organic light-emitting display with a counter substrate that can display colors will be explained. FIG. 3 is a schematic cross section of an organic light-emitting display of this embodiment. FIG. 4 is a plan view of pixels.

Stripes of first transparent electrodes 302, 302' are formed from an ITO film on the glass substrate 301. The manufacturing conditions are the same as those of the embodiment 1, with the film thickness set to 140 nm, the stripe width to 100 μm and the electrode-to-electrode distance to 120 μm.

Over the first transparent electrodes 302, 302' a positive type photosensitive passivation film (JSR make: PC452) was formed by using a spin coat method at a coating rate of 1000 rpm/30 sec. The substrate was put on a hot plate and pre-baked at 90° C. for two minutes.

Next, the substrate was exposed to a mixture of ghi lines through a photomask to form contact holes in the form of stripes. Next, by using a developer of JSR make (PD-523), the exposed image was developed at room temperature for 40 seconds and rinsed with running pure water at room temperature for 60 seconds. After rinsing, the substrate was post-exposed to light with a wavelength of 365 nm at an intensity of 300 mJ/cm$^2$ and then post-baked in a clean oven at 200° C. for one hour.

The interlayer insulating film 311 formed of PC452 was 2 μm thick and covered the edge portions of the ITO stripes to 20 μm inside the edges.

Next, the glass substrate 301 formed with the first transparent electrode 302 and the interlayer insulating film 311 was cleaned. The cleaning method is similar to that used in the embodiment 1.

Then, an α-NPD film 40 nm thick was formed by the vacuum deposition. About 50 mg of the material was put in a sublimate boat of Mo and evaporated at a controlled deposition rate of 0.15±0.05 nm/sec.

This α-NPD film functions as an organic hole transport layer 303. Over this layer was formed a film of tetrazole derivative 20 nm thick (hereinafter abbreviated p-EtTAZ film) by vacuum deposition.

The material was placed in a sublimate boat of Mo and evaporated at a controlled deposition rate of 0.15±0.05 nm/sec. This p-EtTAZ film functions as an organic hole block layer 304.

Over this layer was formed an Alq film 10 nm thick by vacuum deposition. Approximately 10 mg of the material was put in a sublimate boat of Mo and evaporated at a controlled deposition rate of 0.15±0.05 nm/sec. This Alq film functions as an organic green light-emitting layer 305.

Next, a co-deposited film of Alq and Nile red (hereinafter abbreviated Nr) was formed to a thickness of 10 nm by a vacuum co-deposition from two separate sources.

About 10 mg of Alq and about 5 mg of Nr were put in two sublimate boats made of Mo and were evaporated at controlled deposition rates of 0.40±0.05 nm/sec and 0.01±0.005 nm/sec, respectively. The Alq+Nr co-deposited film functions as an organic red light-emitting layer 306.

Over this co-deposited film an Alq film was formed to a thickness of 10 nm by vacuum deposition. About 10 mg of the material was put in a sublimate boat of Mo and evaporated at a controlled rate of 0.15±0.05 nm/sec. The Alq film functions as an organic electron transport layer 307.

Next, an electron injection layer 308 was formed to a thickness of 10 nm and a transparent electrode 309 to a thickness of 30 nm, thus forming a second transparent electrode 310. The manufacturing conditions are similar to those of the embodiment 1, except for the film thickness. By using a shadow mask, the second transparent electrode 310 was formed into stripes at a pitch of 100 µm, each measuring 200 µm in width.

This organic electroluminescent substrate 312 was placed in the sealing chamber whose dew point was kept below −90° C., as in the second embodiment 2.

Next, on a glass substrate 318 was formed a rib 317 by using a photosensitive paste method. A photosensitive paste containing a photosensitive organic component and inorganic powder was applied to the glass substrate 318 by a spin coat method and exposed to ultraviolet light through an emulsion mask and then developed. Next, it is baked to form the rib 317 µm thick.

Next, the substrate was sputtered with an aluminum film 150 nm thick and then an auxiliary electrode 315 was formed by photolithography. The electrode width is 60 µm and the electrode-to-electrode distance is 300 µm.

Then, color filters 316, 316' are formed on the glass substrate 318. The color filters were formed in stripes by etching and arranged in the order of red, green and blue.

Next, a high-precision dispenser (Musashi Engineering make: SMA-3A) was used to apply a photo-cured resin 314 containing fine metal particles onto the auxiliary electrode 315. The seal width of the photo-cured resin is 20 µm. With the above process complete, a counter substrate 319 is formed.

Next, before loading the counter substrate 319 into the sealing chamber, the optically cured resin is degassed in vacuum for more than 10 minutes.

Next, the organic electroluminescent substrate 312 and the counter substrate 319 are bonded together in the following procedure. A CCD camera is used to adjust the positions of color filters so that they are aligned with the pixels. After the fine positional adjustment, these substrates are bonded together under a pressing load of 0.5 kgf/cm². With a light shielding mask placed on the counter substrate 319 to protect the pixel areas 323, 323' from ultraviolet light, the optically cured resin 314 is hardened. The curing condition is the same as that of the embodiment 2.

In this invention, because of the rib 317, 20 µm high, formed on the counter substrate 319, a light extraction layer 313 filled with dry nitrogen with a refractive index of 1 is formed between the organic electroluminescent substrate 312 and the counter substrate 319.

The pixels 323, 323' on the organic electroluminescent substrate 312 emit white rays of light 321, 321'. At the boundary between the α-NPD and the P-EtTAZ, cyan light is produced; green light is produced in the Alq film; and red light is produced in the Alq+Nr film. These colors are mixed together to form white rays.

The light originating from the light-emitting area farthest from the second transparent electrode 310 is cyan that is produced at the boundary surface between the α-NPD and the P-EtTAZ. The distance d from the cyan light-emitting area (λ=440 nm) to the light extraction layer 313 is given as follows and satisfies the equation (1).

$$d \approx 100 \text{ nm } (=20+10+10+20+10+30) < 110 \text{ nm } (=\lambda/4)$$

Hence, as in the embodiment 1, no total reflection occurs at the boundary surface between the second transparent electrode 310 and the light extraction layer 313 for the outgoing light with an incident angle greater than the critical angle. The produced light therefore propagates into the light extraction layer 313.

The white light that has entered into the light extraction layer 313 is turned into single-color light of red, green and blue 322, 322' by color filters 316, 316' on the counter substrate 319. When they go out into the air layer 320 with a refractive index of 1, the total reflection is eliminated, reducing the total reflection loss. Hence, the total quantity of light produced by the organic light-emitting element of this embodiment has increased to 1.5 times that of the element of normal thickness.

The provision of the auxiliary electrode 315 lowers the resistance to 1/1000 that of the construction having only the second transparent electrode 310, thus reducing power consumption.

Embodiment 4

Next, an example arrangement of the auxiliary electrode required by the embodiment 1 will be explained.

Figure 5A:
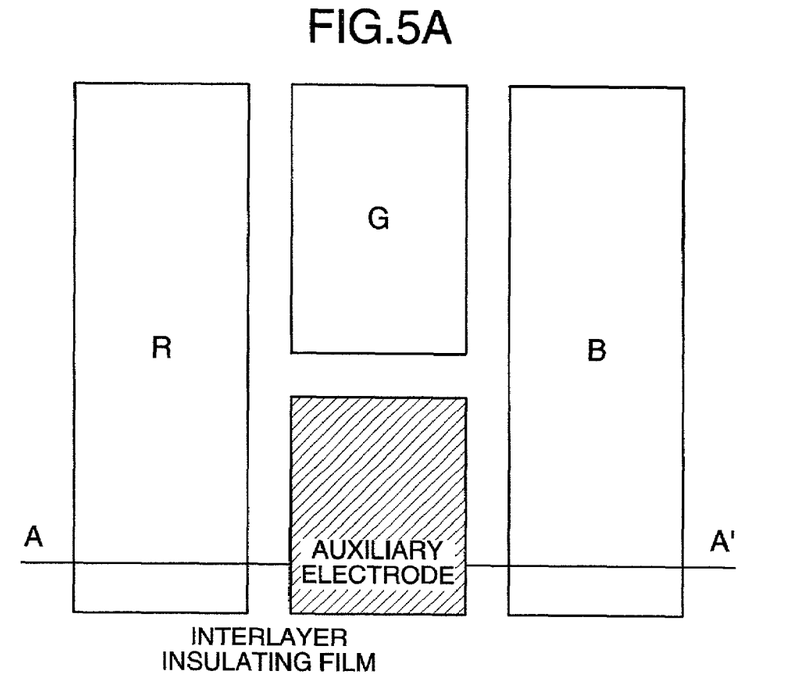
FIG. 5A illustrates an arrangement of electrodes in an organic light-emitting element according to an embodiment 4 of the present invention.

As shown in FIG. 5A, in the light-emitting layers of R (red), G (green) and B (blue) for each pixel, the auxiliary electrode 315 shown in the embodiment 1 is arranged in a part of a sub-pixel. The sub-pixel is intended to change the color of each pixel. R, G and B are illuminated independently of each other to produce a variety of colors.

For example, the area of a sub-pixel for G may be reduced to one-half. In that case, the brightness of G is doubled to keep the total quantity of light unchanged. Increasing the brightness level results in a power efficiency reduction of only about 10%.

Although this arrangement reduces the life of the G-OLED (green organic light-emitting diode) to one-half, the G-OLED itself originally has more than two times the life of R-OLED or B-OLED and there is no problem with the organic light-emitting display as a whole.

Figure 5B:
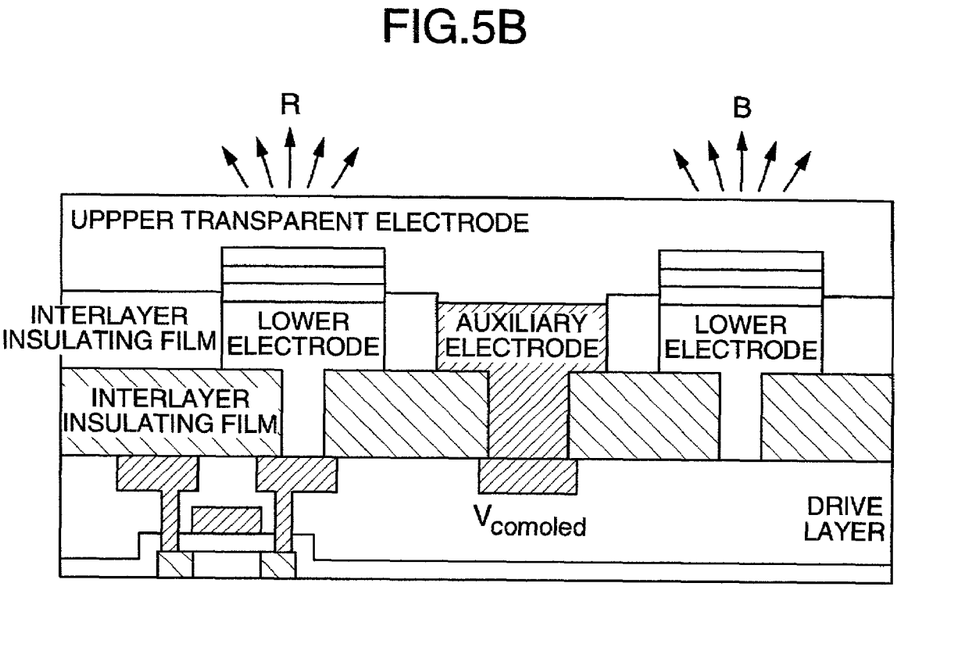
FIG. 5B is a cross-sectional view taken along the line A-A' of FIG. 5A.

This arrangement considers the service longevities and emission efficiencies of the currently used materials. Comparison in the service life and emission efficiency between the R, G and B OLEDs shows that the life of the G-OLED is approximately two times longer than those of other OLEDs, R-OLED and B-OLED. This allows the auxiliary electrode to be located in a part of the G-OLED. A cross section along A-A' of FIG. 5A is shown in FIG. 5B.

Taking the light emission longevity and efficiency of each OLED into consideration as described above makes it possible to provide a practical organic light-emitting display.

Embodiment 5

An example case where the upper transparent electrode used in this invention is formed from an ultra-thin metal film will be explained.

Figure 6A:
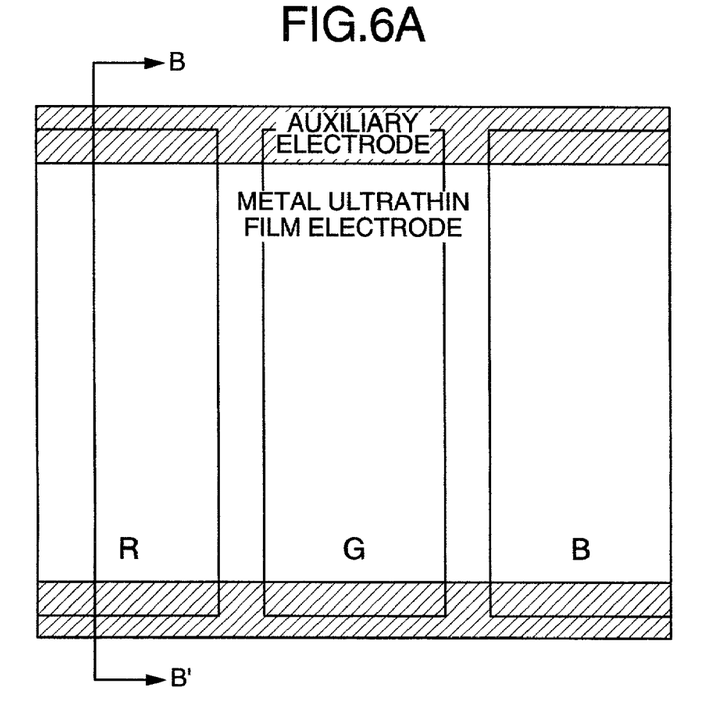
FIG. 6A illustrates a structure of an organic light-emitting element according to an embodiment 5 of the present invention.

FIG. 6A illustrates a structure of an organic light-emitting element in which a very thin film of, for example, platinum (Pt) or gold (Au) is arranged on the R, G and B OLEDs in each pixel and an auxiliary electrode is placed on the metal ultra-thin film.

Figure 6B:
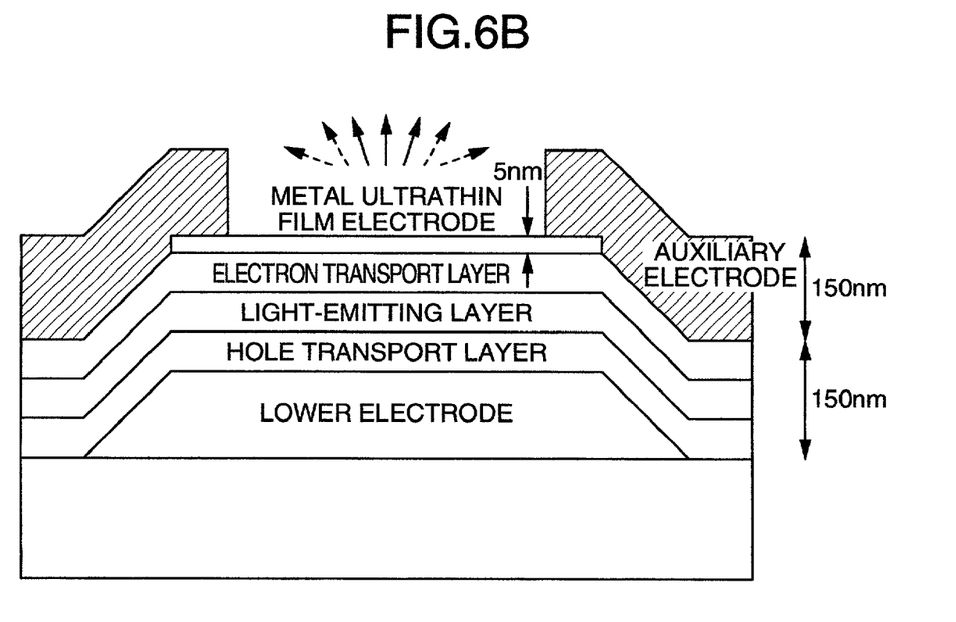
FIG. 6B is a cross-sectional view taken along the line B-B' of FIG. 6A.

FIG. 6B is a cross section taken along the line B-B' of FIG. 6A. As shown in the figure, the use of the metal ultra-thin film about 5 nm thick offers an advantage of being able to reduce a possible damage the forming of the second transparent electrode may cause to the lower organic layers, when compared with the construction in which the second transparent electrode on the light extraction side is used instead of the metal ultra-thin film electrode as is the case with other embodiments.

In this invention, the organic light-emitting element in each pixel produces white light which passes through the color filters formed on the counter substrate and goes out as single-color rays of red, green and blue into the air layer.

The present invention is also effectively applied to other color producing systems in which a red organic light-emitting element, a green organic light-emitting element and a blue organic light-emitting element are formed one in each pixel and single-color rays of red, green and blue are emitted out into the air layer. In this case, there is no need to form color filters on the counter substrate. It is desired that the distance d to the light extraction layer 313 meet the equation (1) for the center wavelength of the emission in each pixel.

Embodiment 6

An example case in which the organic light-emitting display of this invention is applied to a mobile phone will be described. The construction of the organic light-emitting elements that form each pixel of the organic light-emitting display is similar to that of the embodiment 3. The number of pixels employed is 160×120.

A first transparent electrode line is connected to an anode driver and a second transparent electrode line to a cathode driver. A frame frequency is set to 100 Hz. A data signal train is sent from the anode driver to each line and at the same time the cathode driver activates address signals successively line by line. The on-state current value is set to 6 μA for each pixel. The address signal is set to 0 V when it is turned on and 7.5 V when turned off. Hence, when the address signal was on, the voltage between the cathode and the anode was found to be 7.5 V and the instantaneous brightness 1000 cd/m². When the address signal was off, the cathode-anode voltage was 0 V and no light was produced.

While in this embodiment the size of each RGB pixel is set to 200×100 μm², other sizes may also be used.

As in the embodiment 3, the total quantity of light emitted from the organic light-emitting element has increased to 1.5 times that of the element of normal thickness. The provision of the auxiliary electrode reduces the resistance to less than $\frac{1}{1000}$ that of the construction with only the second transparent electrode. This in turn reduces power consumption.

With this invention, when the light emitted from the organic light-emitting layer in the organic layers goes out into the air layer with a refractive index of 1, the loss due to the total reflection can be reduced, thus improving the extraction efficiency of the light produced.

Further, the provision of the light extraction layer in the organic light-emitting element having a counter substrate and also in the organic light-emitting display can reduce the loss due to the total reflection that may occur when light produced inside is transmitted out into an air layer with a refractive index of 1. This in turn can improve the light extraction efficiency.

It should be further understood by those skilled in the art that the foregoing description has been made on embodiments of the invention and that various changes and modifications may be made in the invention without departing from the spirit of the invention and the scope of the appended claims.

What is claimed is:

1. An organic light-emitting display comprising:
    an organic electroluminescent (EL) substrate having a drive layer formed on the organic EL substrate; a first electrode formed on the drive layer; organic layers formed on the first electrode; a second electrode formed on the organic layers; and a plurality of pixels;
    a counter substrate formed adjacent the organic EL substrate; and
    a light extraction layer formed between the organic EL substrate and the counter substrate;
    wherein each of the plurality of pixels includes a plurality of sub-pixels and is disposed such that an auxiliary electrode of the second electrode is disposed in a part of one of the sub-pixels, wherein the auxiliary electrode is formed on a same level as the first electrode and is connected to a current supply line within the drive layer via a contact hole formed in an inter-layer insulating layer formed over the drive layer.

2. The organic light-emitting display according to claim 1, wherein the plurality of sub-pixels comprises a red organic light-emitting layer, a green organic light-emitting layer and a blue organic light-emitting layer.

3. The organic light-emitting display according to claim 1, further comprising a rib for controlling a thickness of the light extraction layer.

4. The organic light-emitting display according to claim 3, wherein the rib is formed on the counter substrate.

5. The organic light-emitting display according to claim 3, wherein the rib is formed of a glass or a photo-curing resin.

6. The organic light-emitting display according to claim 3, wherein the rib is formed on a sealing portion of the counter substrate and the organic EL substrate.

7. The organic light-emitting display according to claim 1, wherein a color filter is disposed between the organic EL substrate and the counter substrate.

8. An organic light-emitting display comprising:
    an organic electroluminescent (EL) substrate having a drive layer formed on the organic EL substrate; a first electrode formed on the drive layer; organic layers formed on the first electrode; a second electrode formed on the organic layers; and a plurality of pixels;
    a counter substrate formed adjacent the organic EL substrate; and
    a light extraction layer formed between the organic EL substrate and the counter substrate;
    wherein each of the plurality of pixels includes a plurality of sub-pixels and is disposed such that an auxiliary electrode of the second electrode is disposed in a part of one of the sub-pixels, wherein the auxiliary electrode is formed on a same level as the first electrode and is connected to a current supply line within the drive layer via a contact hole formed in an inter-layer insulating layer formed over the drive layer,
    further comprising a rib for controlling a thickness of the light extraction layer.

9. The organic light-emitting display according to claim 8 wherein the plurality of sub-pixels comprises a red organic light-emitting layer, a green organic light-emitting layer and a blue organic light-emitting layer.

10. The organic light-emitting display according to claim 8, wherein the rib is formed on the counter substrate.

11. The organic light-emitting display according to claim 8, wherein the rib is formed of a glass or photo-curing resin.

12. The organic light-emitting display according to claim 8, wherein the rib is formed on a sealing portion of the counter substrate and the organic EL substrate.

13. The organic light-emitting display according to claim 8, wherein a color filter is disposed between the organic EL substrate and the counter substrate.

* * * * *